United States Patent
Watanabe et al.

(10) Patent No.: US 10,950,615 B2
(45) Date of Patent: Mar. 16, 2021

(54) SEMICONDUCTOR MEMORY DEVICE AND MANUFACTURING METHOD THEREOF

(71) Applicant: Toshiba Memory Corporation, Minato-ku (JP)

(72) Inventors: Yuta Watanabe, Yokkaichi (JP); Akira Mino, Yokkaichi (JP); Masahisa Sonoda, Yokkaichi (JP); Takashi Shimizu, Nagoya (JP)

(73) Assignee: Toshiba Memory Corporation, Minato-ku (JP)

( * ) Notice: Subject to any disclaimer, the term of this patent is extended or adjusted under 35 U.S.C. 154(b) by 42 days.

(21) Appl. No.: 16/294,982

(22) Filed: Mar. 7, 2019

(65) Prior Publication Data
US 2019/0386018 A1 Dec. 19, 2019

(30) Foreign Application Priority Data
Jun. 18, 2018 (JP) .............................. JP2018-115500

(51) Int. Cl.
*H01L 27/11578* (2017.01)
*H01L 27/11582* (2017.01)
(Continued)

(52) U.S. Cl.
CPC .. *H01L 27/11578* (2013.01); *H01L 27/11521* (2013.01); *H01L 27/11551* (2013.01); *H01L 27/11568* (2013.01)

(58) Field of Classification Search
CPC ......... H01L 27/11578; H01L 27/11551; H01L 27/11521; H01L 27/11568;
(Continued)

(56) References Cited

U.S. PATENT DOCUMENTS 7,294,534 B2 11/2007 Iwaki
9,728,550 B2 * 8/2017 Omura .............. H01L 27/11568
(Continued)

FOREIGN PATENT DOCUMENTS

JP 9-311432 12/1997
JP 2006-119195 5/2006
(Continued)

*Primary Examiner* — Laura M Menz
*Assistant Examiner* — Khatib A Rahman
(74) *Attorney, Agent, or Firm* — Oblon, McClelland, Maier & Neustadt, L.L.P.

(57) ABSTRACT

A semiconductor memory device of embodiments includes a semiconductor substrate having a first and a second region adjacent to the first region in a first direction, a laminated body including electrode layers laminated on the semiconductor substrate in a second direction, a first insulator splitting the laminated body at the second region in a third direction, and extending in the first and second direction, and branching into two insulator films at the first region, and enclosing continuously a first portion of the laminated body, a contact portion extending in the first portion in the second direction, and a memory portion extending through the laminated body and the first insulator in the second direction at the second region. A first width in the third direction of the first portion is wider than a second width in the third direction of at least one of the electrode layers at the second region.

5 Claims, 15 Drawing Sheets

(51) Int. Cl.
*H01L 27/11565* (2017.01)
*H01L 27/11551* (2017.01)
*H01L 27/11521* (2017.01)
*H01L 27/11568* (2017.01)

(58) Field of Classification Search
CPC ......... H01L 27/11565; H01L 27/11582; H01L 27/11575
See application file for complete search history.

(56) References Cited

U.S. PATENT DOCUMENTS

| | | |
|---|---|---|
| 9,960,173 B2 | 5/2018 | Shimojo |
| 2006/0084261 A1 | 4/2006 | Iwaki |
| 2014/0284674 A1* | 9/2014 | Iwai .................. H01L 27/11582 257/298 |
| 2015/0221667 A1* | 8/2015 | Fukuzumi ......... H01L 29/66833 257/314 |
| 2017/0077108 A1* | 3/2017 | Kawaguchi ....... H01L 27/11582 |
| 2017/0179151 A1 | 6/2017 | Kai et al. |
| 2017/0263613 A1 | 9/2017 | Murakoshi et al. |
| 2017/0263618 A1* | 9/2017 | Shimojo ........... H01L 27/11519 |
| 2017/0263625 A1* | 9/2017 | Kikutani ........... H01L 27/11575 |
| 2017/0263634 A1* | 9/2017 | Inokuma .......... H01L 27/11565 |
| 2017/0263638 A1 | 9/2017 | Okada |
| 2018/0047744 A1 | 2/2018 | Utsumi |
| 2018/0301374 A1* | 10/2018 | Masamori ......... H01L 27/11575 |

FOREIGN PATENT DOCUMENTS

| | | |
|---|---|---|
| JP | 2017-163044 | 9/2017 |
| JP | 2017-163057 | 9/2017 |
| JP | 2017-163114 | 9/2017 |
| JP | 2018-26518 | 2/2018 |

\* cited by examiner

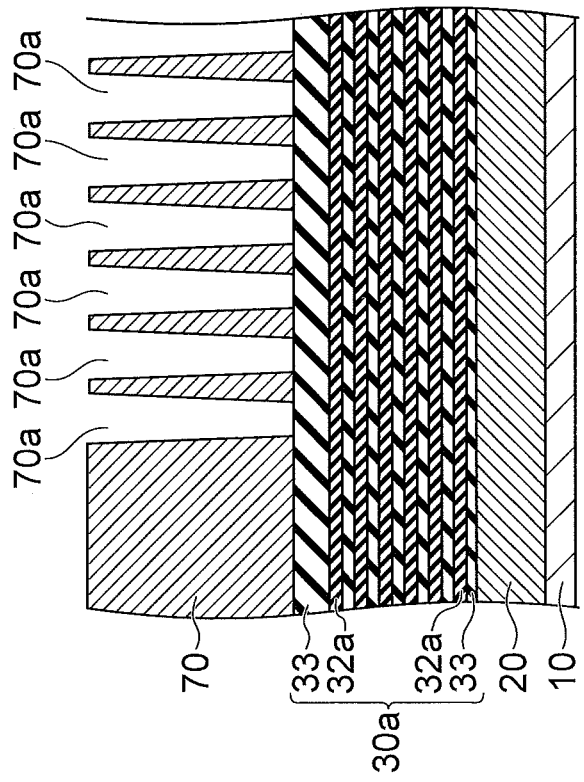
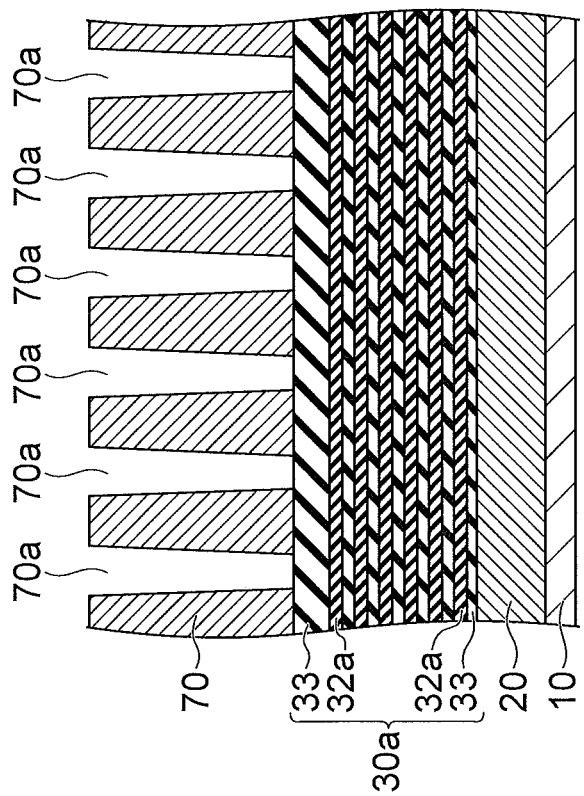
FIG. 4A
FIG. 4B

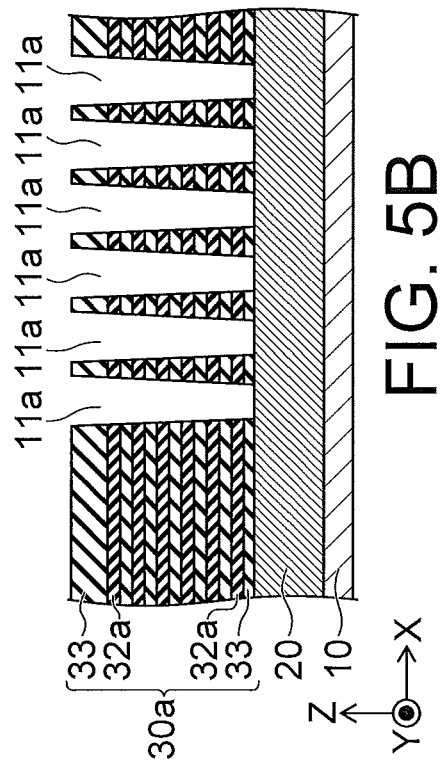
FIG. 5A
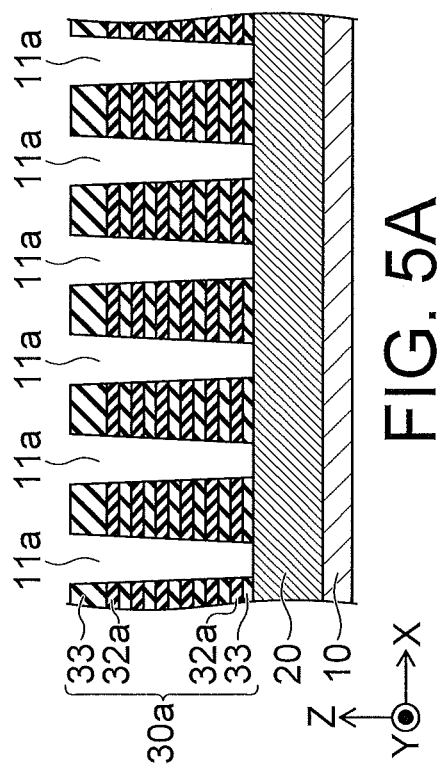
FIG. 5B
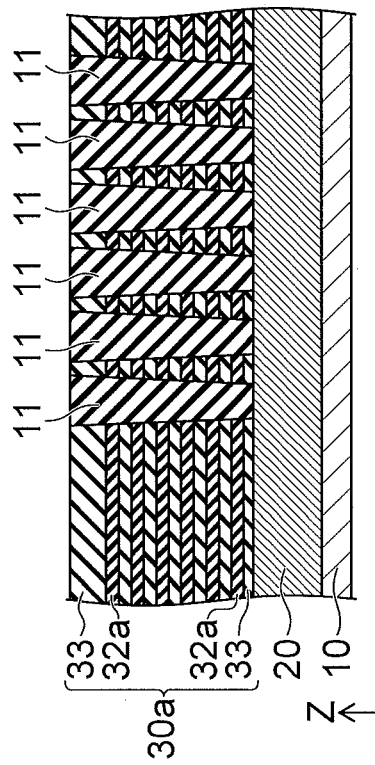
FIG. 5C
FIG. 5D

SEMICONDUCTOR MEMORY DEVICE AND MANUFACTURING METHOD THEREOF

CROSS-REFERENCE TO RELATED APPLICATIONS

This application is based upon and claims the benefit of priority from Japanese Patent Application No. 2018-115500, filed on Jun. 18, 2018; the entire contents of which are incorporated herein by reference.

FIELD

Embodiments of the present invention relate to a semiconductor memory device and a manufacturing method thereof.

BACKGROUND

A stacked semiconductor memory device in which memory cells are stacked in a three-dimensional manner is known. In recent years, for the stacked semiconductor memory device, a manufacturing method in which memory holes are formed at laminated bodies which are split with slits, and, further, memory cells are formed within the memory holes, has been known.

To realize higher speed of driving of the memory cells, a width of a contact portion is preferably large. Meanwhile, to arrange the memory cells in high density, it is preferable to finely split the laminated body with a number of slits. However, in this case, because a width of the laminated body becomes narrow, an area where the contact portion is to be formed becomes small. Therefore, there is a possibility that workability of the contact portion may degrade.

BRIEF DESCRIPTION OF THE DRAWINGS

FIG. 4A is a cross-section diagram taken along a line B-B in FIG. 3;

FIG. 4B is a cross-section diagram taken along a line C-C in FIG. 3;

FIG. 5A is a cross-section diagram illustrating slit formation process;

FIG. 5B is a cross-section diagram illustrating slit formation process;

FIG. 5C is a cross-section diagram illustrating insulator embedment process;

FIG. 5D is a cross-section diagram illustrating insulator embedment process;

DETAILED DESCRIPTION

Embodiments will now be explained with reference to the accompanying drawings. The present invention is not limited to the embodiments.

A semiconductor memory device according to the present embodiment includes a semiconductor substrate, the semiconductor substrate having a first region and a second region adjacent to the first region in a first direction parallel to the semiconductor substrate; a laminated body including a plurality of electrode layers laminated on the first region and the second region of the semiconductor substrate in a second direction perpendicular to the semiconductor substrate; a first insulator splitting the laminated body at the second region in a third direction orthogonal to the first direction and second direction, and extending in the first direction and the second direction, and branching into two insulator films at the first region, and enclosing continuously a first portion of the laminated body with the two insulator films; a contact portion extending in the first portion of the laminated body in the second direction; and a memory portion extending through the laminated body and the first insulator in the second direction at the second region. A first width in the third direction of the first portion of the laminated body is wider than a second width in the third direction of at least one of the electrode layers split with the first insulator at the second region.

First Embodiment

Figure 1:
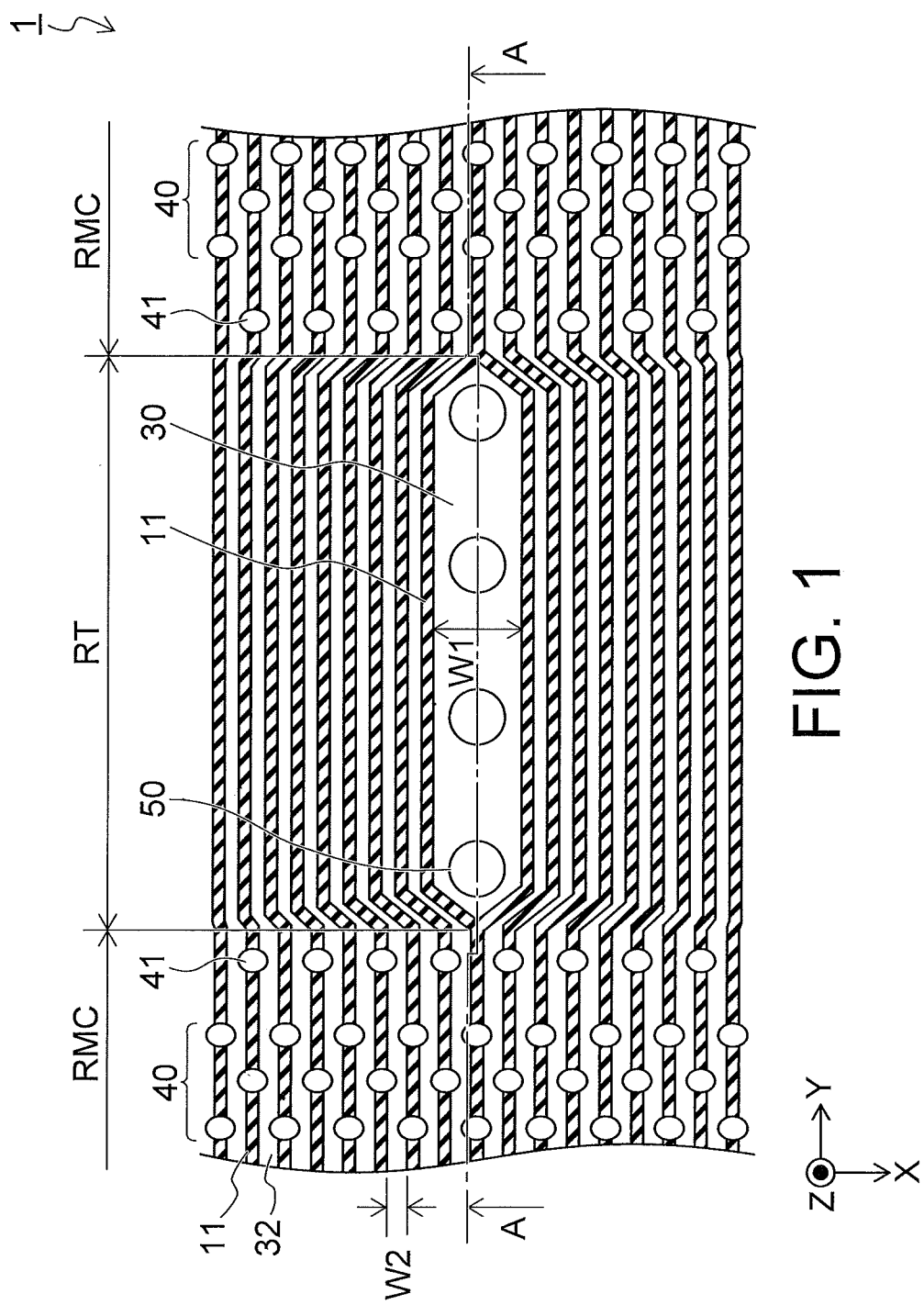
FIG. 1 is a plan view of a semiconductor memory device according to a first embodiment.
Figure 2:
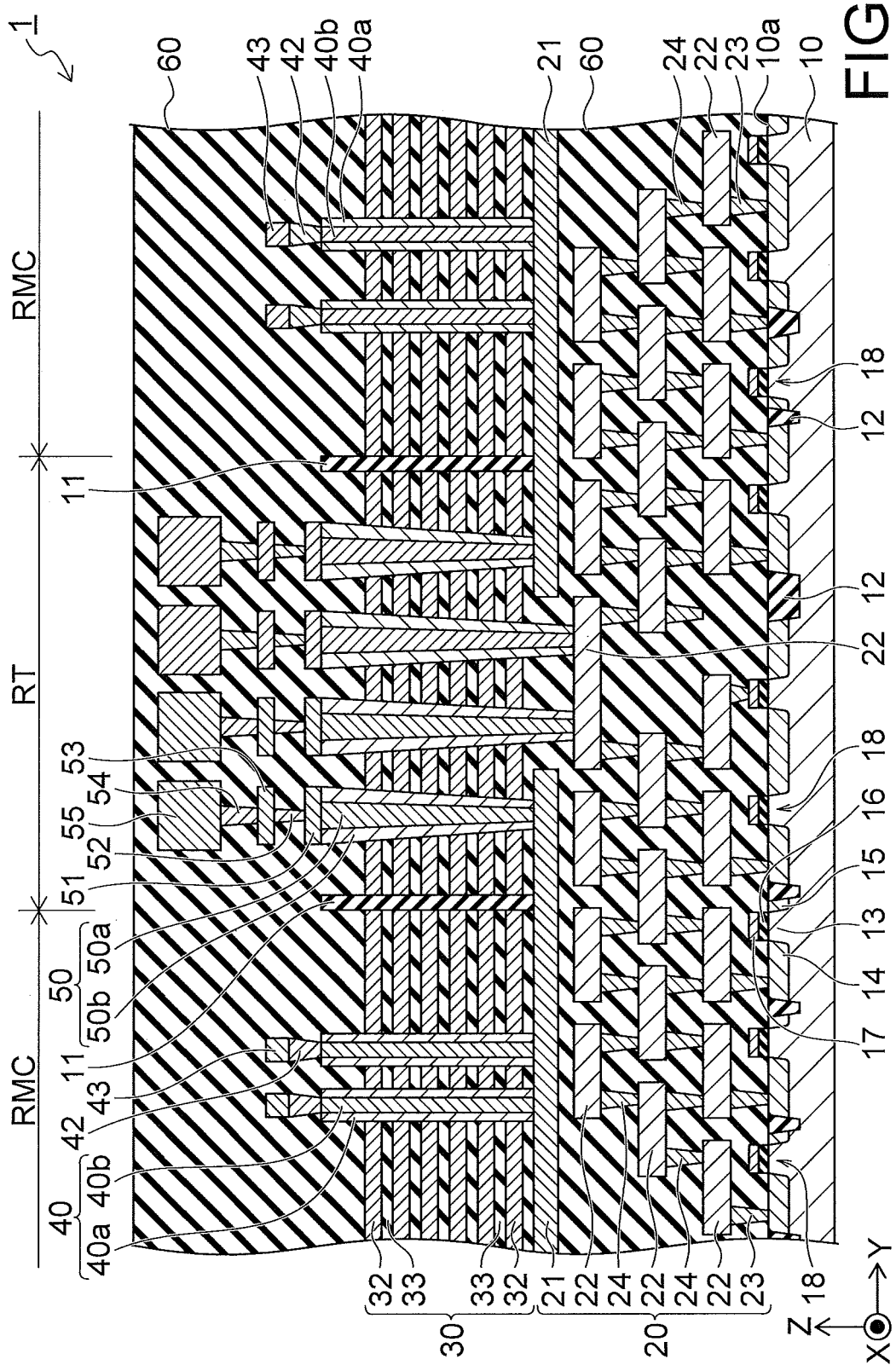
FIG. 2 is a cross-section diagram taken along a line A-A illustrated in FIG. 1.

FIG. 1 is a plan view of a semiconductor memory device according to a first embodiment. Further, FIG. 2 is a cross-section diagram taken along a line A-A illustrated in FIG. 1. The semiconductor memory device 1 illustrated in FIG. 1 and FIG. 2 is a stacked three-dimensional semiconductor memory in which memory cells are stacked in a three-dimensional manner. This semiconductor memory device 1 includes a semiconductor substrate 10, an insulator 11, conductive layers 20, a laminated body 30, a memory portion 40 and a contact portion 50.

In the following description, two directions which are parallel to an upper surface 10a of the semiconductor substrate 10 and which are orthogonal to each other are set as an X direction and a Y direction, and a direction perpendicular to the upper surface 10a is set as a Z direction. Further, the Y direction corresponds to the first direction, the Z direction corresponds to the second direction, and the X direction corresponds to the third direction.

The semiconductor substrate 10 is, for example, a silicon semiconductor substrate. STIs (Shallow Trench Isolations) 12 are selectively provided at an upper layer portion of the semiconductor substrate 10. The upper layer portion of the semiconductor substrate 10 is segmented into a plurality of semiconductor regions 13 by the STIs 12. Within at least part of the semiconductor regions 13, source layers 14 and drain layers 15 are formed. Gate insulation films 16 and gate electrodes 17 are provided immediately above regions between the source layers 14 and the drain layers 15. By this means, a plurality of field-effect transistors 18 are formed on the upper surface 10*a* of the semiconductor substrate 10.

The conductive layers 20 are provided between the semiconductor substrate 10 and the laminated body 30. For example, three layers of wirings 22 are provided in the conductive layers 20. Contact plugs 23 are connected between the semiconductor substrate 10 and the wiring 22 in the lowermost layer. The wirings 22 which are separate from each other in the Z direction are electrically connected through vias 24. The wirings 22, the contact plugs 23 and the vias 24 are provided within an interlayer dielectric 60.

An embedded source line 21 is provided on the wiring 22 in the uppermost layer. The embedded source line 21 is, for example, a two-layered film including a lower layer portion containing tungsten (W) and an upper layer portion containing silicon (Si). The embedded source line 21 is divided into a plurality of portions in the Y direction. Each portion of the embedded source line 21 is energized via the contact portion 50.

The laminated body 30 is provided on the embedded source line 21. At the laminated body 30, an electrode film (electrode layer) 32 and an insulation film 33 are alternately laminated in the Z direction. The electrode film 32 contains a metal such as, for example, tungsten. The insulation film 33 contains, for example, silicon oxide ($SiO_2$). As illustrated in FIG. 1, the laminated body 30 is split into a plurality of portions in the X direction with a plurality of insulators 11. As a result, each electrode film 32 has a shape of a wiring extending in the Y direction.

The insulator 11 is an example of the first insulator, and contains silicon oxide. A lower end of the insulator 11 has contact with the embedded source line 21. The insulator 11 has a shape of a sheet expanding along a YZ plane.

The insulator 11 and the laminated body 30 have a tap region RT and a memory cell region RMC. The tap region RT is an example of the first region, and the memory cell region RMC is an example of the second region.

First, the tap region RT will be described. As illustrated in FIG. 1, in the tap region RT, part of the laminated body 30 is continuously enclosed with the insulator 11. Within the tap region RT, a plurality of contact portions 50 are arranged in a line along the Y direction. A width W1 (first width) of the tap region RT in the X direction is wider than a width W2 (second width) of the laminated body 30 in the X direction within the memory cell region RMC. Therefore, a region where the contact portion 50 with a large radius is to be formed can be sufficiently secured within the tap region RT. Here, a structure of each contact portion 50 will be described.

As illustrated in FIG. 2, each contact portion 50 penetrates through the laminated body 30 in the Z direction. In the present embodiment, lower ends of the contact portions 50 located at both ends of the line have contact with the embedded source line 21, and lower ends of the remaining contact portions 50 have contact with the wiring 22 in the uppermost layer.

As illustrated in FIG. 2, an upper end of each contact portion 50 has contact with an intermediate wiring 51. An intermediate wiring 53 is provided on the intermediate wiring 51. The intermediate wiring 51 and the intermediate wiring 53 are electrically connected via a plug 52. An upper layer wiring 55 is provided on the intermediate wiring 53. The intermediate wiring 53 and the upper layer wiring 55 are electrically connected via a plug 54. The intermediate wirings 51 and 53, the plugs 52 and 54 and the upper layer wiring 55 are provided within the interlayer dielectric 60.

Further, as illustrated in FIG. 2, at each contact portion 50, an outer peripheral portion of a conductor 50*a* is covered with the insulation film 50*b*. The conductor 50*a* is insulated from the electrode film 32 by the insulation film 50*b*.

Subsequently, the memory cell region RMC will be described. The memory cell region RMC is adjacent to the tap region RT in the Y direction. In other words, the tap region RT is disposed between two memory cell regions RMCs which are separate from each other in the Y direction.

As illustrated in FIG. 1, a plurality of memory portions 40 and a plurality of insulators 41 are provided within the memory cell region RMC. The plurality of memory portions 40 are disposed in a zigzag manner.

Each memory portion 40 penetrates through the insulator 11 and the laminated body 30. As illustrated in FIG. 2, each memory portion 40 includes a memory film 40*a* and a channel film 40*b* enclosed with the memory film 40*a*.

A memory cell is formed at a portion where the memory film 40*a* intersects with the electrode film 32. The memory film 40*a* includes, for example, a tunnel insulation film (not illustrated) in contact with the channel film 40*b*, a charge block film (not illustrated) in contact with the tunnel insulation film, and a charge accumulation film (not illustrated) in contact with the charge block film. The charge block film and the tunnel insulation film are formed as, for example, silicon oxide films. The charge accumulation film is formed as, for example, a silicon nitride (SiN) film.

The channel film 40*b* is formed as, for example, a polysilicon film. The channel film 40*b* is electrically connected to a bit line 43 via the plug 42. The plug 42 and the bit line 43 are provided within the interlayer dielectric 60.

In the present embodiment, the electrode films 32 adjacent in the X direction are insulated from each other via the insulator 11. Therefore, two memory cells are formed between the memory portion 40 and two facing electrode films 32.

The insulator 41 penetrates through every other insulator 11 along the X direction. The insulator 41 contains, for example, silicon oxide. The insulator 41 is embedded within a hole formed for forming the electrode film 32 as will be described later.

Main manufacturing process of the above-described semiconductor memory device 1 will be simply described below with reference to FIG. 3 to FIG. 6.

Figure 3:
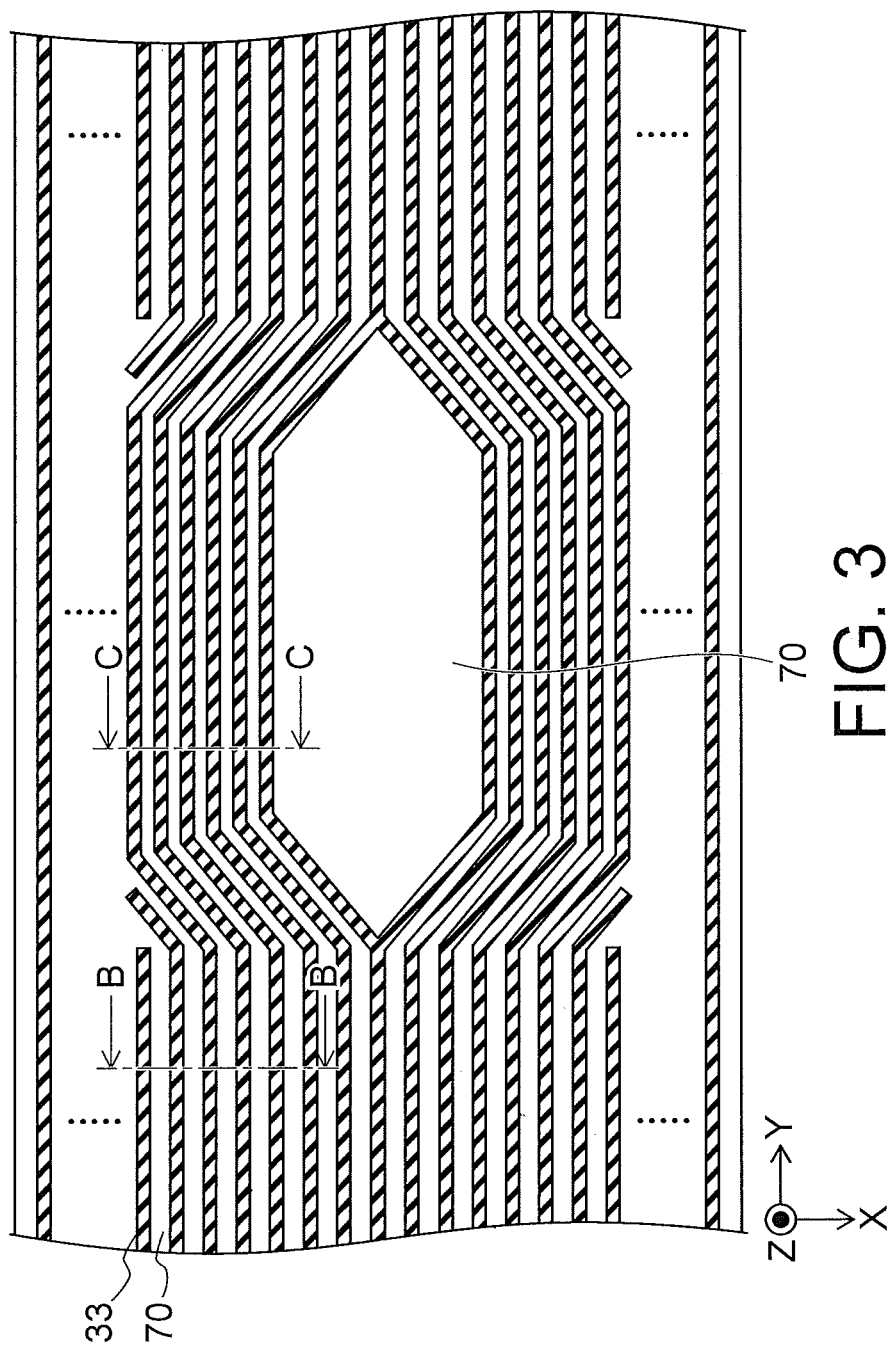
FIG. 3 is a plan view illustrating a pattern of a mask.

FIG. 3 is a plan view illustrating a pattern of a mask. Further, FIG. 4A, FIG. 5A and FIG. 5C are cross-section diagrams taken along a line B-B illustrated in FIG. 3, and FIG. 4B, FIG. 5B and FIG. 5D are cross-section diagrams taken along a line C-C illustrated in FIG. 3.

First, the conductive layers 20 are formed on the semiconductor substrate 10. Subsequently, the laminated body 30*a* is formed on the conductive layers 20. Note that, in FIG. 4A, FIG. 4B and FIG. 5A to FIG. 5D, the conductive layers 20 are illustrated in a simplified manner. At the laminated body 30*a*, the insulation film 32*a* and the insulation film 33 are alternately laminated along the Z direction. The insulation film 32*a* is formed as, for example, a silicon nitride film.

Then, as illustrated in FIG. 4A and FIG. 4B, a mask 70 is formed on the laminated body 30*a*. At the mask 70, a mask pattern is formed by a slit 70*a*. The slit 70*a* is formed along a pattern which splits the laminated body 30*a* in the X direction, that is, a pattern of the insulator 11.

Then, the laminated body 30*a* is etched in the Z direction from the slit 70*a* of the mask 70 through, for example, RIE (Reactive Ion Etching). As a result, as illustrated in FIG. 5A and FIG. 5B, a first slit 11*a* is formed on the laminated body 30a. Subsequently, as illustrated in FIG. 5C and FIG. 5D, the insulator 11 is embedded into the first slit 11a.

Figure 6:
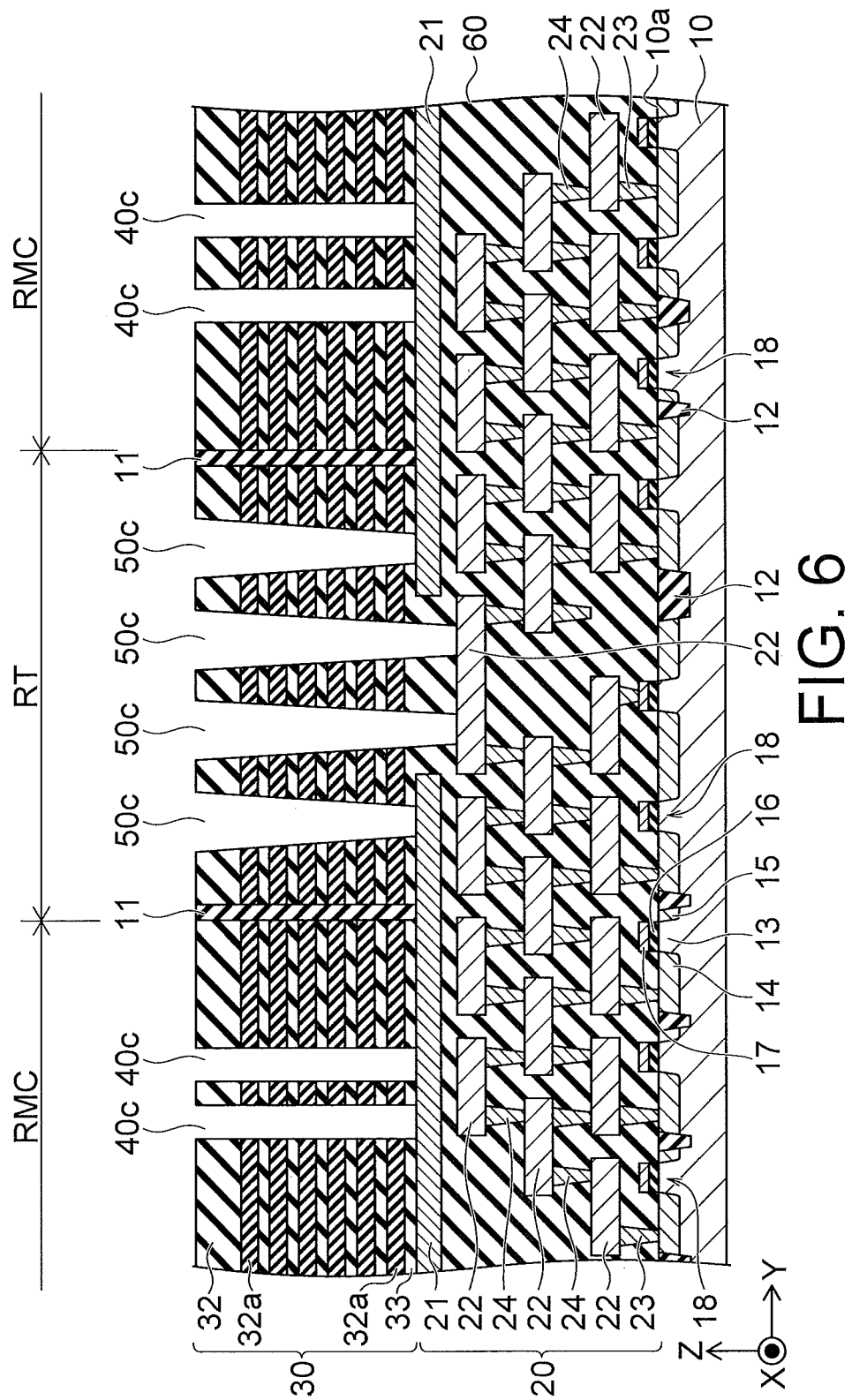
FIG. 6 is a cross-section diagram illustrating hole formation process.

Subsequently, as illustrated in FIG. 6, a first hole 50c is formed within the tap region RT, and a second hole 40c is formed within the memory cell region RMC. At this time, a diameter of the first hole 50c is wider than a diameter of the second hole 40c. Subsequently, returning to FIG. 2, the contact portion 50 is formed within the first hole 50c, and the memory portion 40 is formed within the second hole 40c. Note that the first hole 50c and the second hole 40c may be formed at the same time or may be formed at different times. In the case where the holes are formed at different times, either of the first hole 50c and the second hole 40c may be formed first.

Then, a hole (not illustrated) which penetrates through the insulator 11 and the laminated body 30a is formed within the memory cell region RMC separately from the second hole 40c. The insulation film 32a is removed with, for example, a high-temperature phosphoric acid solution through this hole. Subsequently, the electrode film 32 is formed at a portion where the insulation film 32a has been removed. The electrode film 32 is substituted for the insulation film 32a in this manner. Then, the insulator 41 is embedded in other holes.

According to the present embodiment as described above, by expanding the width W1 of the tap region RT, a region where the contact portion 50 is to be formed is sufficiently secured. By this mean, it is possible to improve workability of the contact portion 50.

Figure 7:
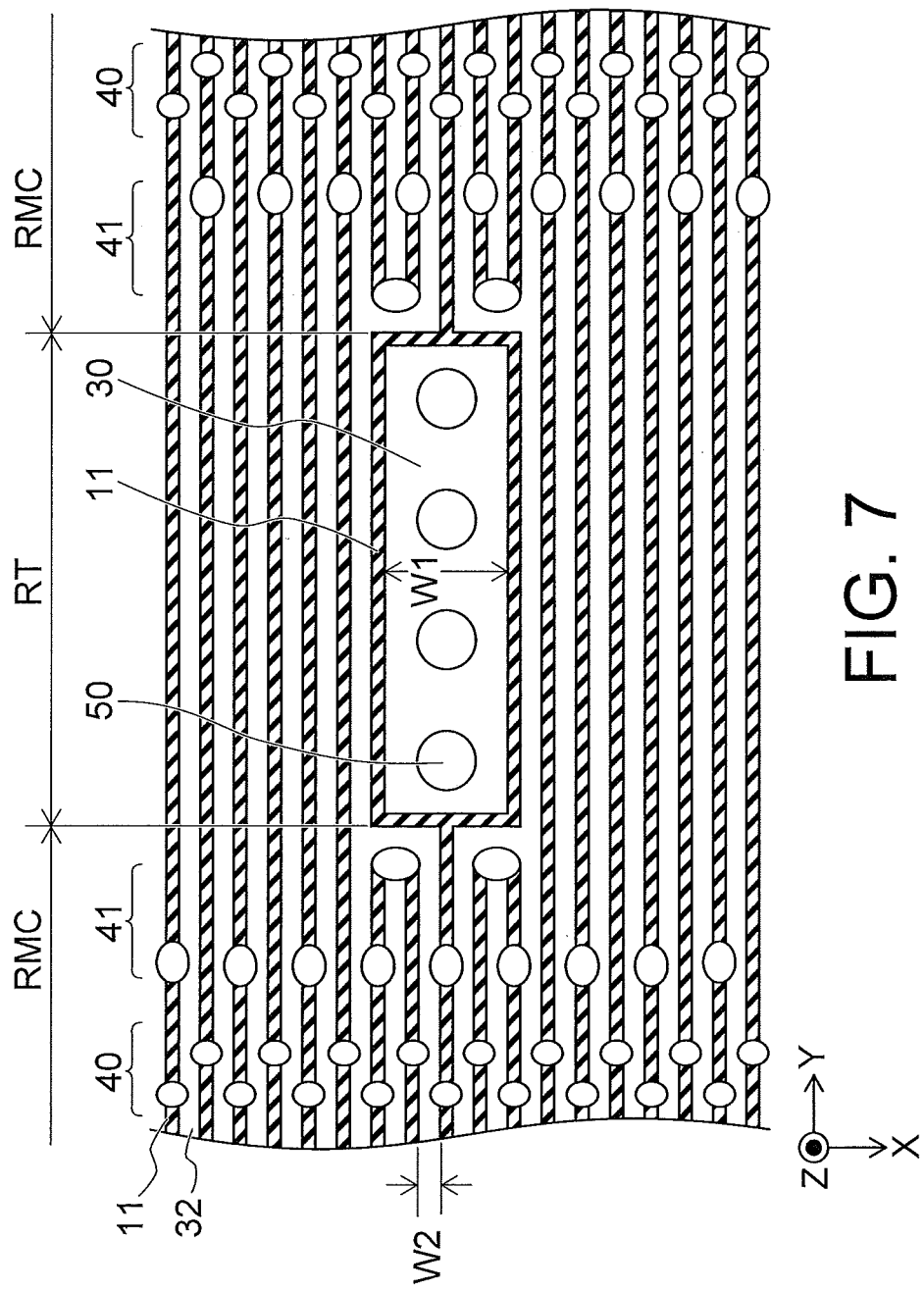
FIG. 7 is a plan view illustrating a modified example of a tap region RT.

Note that, in the present embodiment, a planar shape of the tap region RT is a hexagon. However, the planar shape is not limited to a hexagon, and, for example, may be a rectangle as illustrated in FIG. 7. Also in this case, because it is possible to expand the width W1, the region where the contact portion 50 is to be formed can be sufficiently secured, so that it is possible to improve workability of the contact portion.

Second Embodiment

Figure 8:
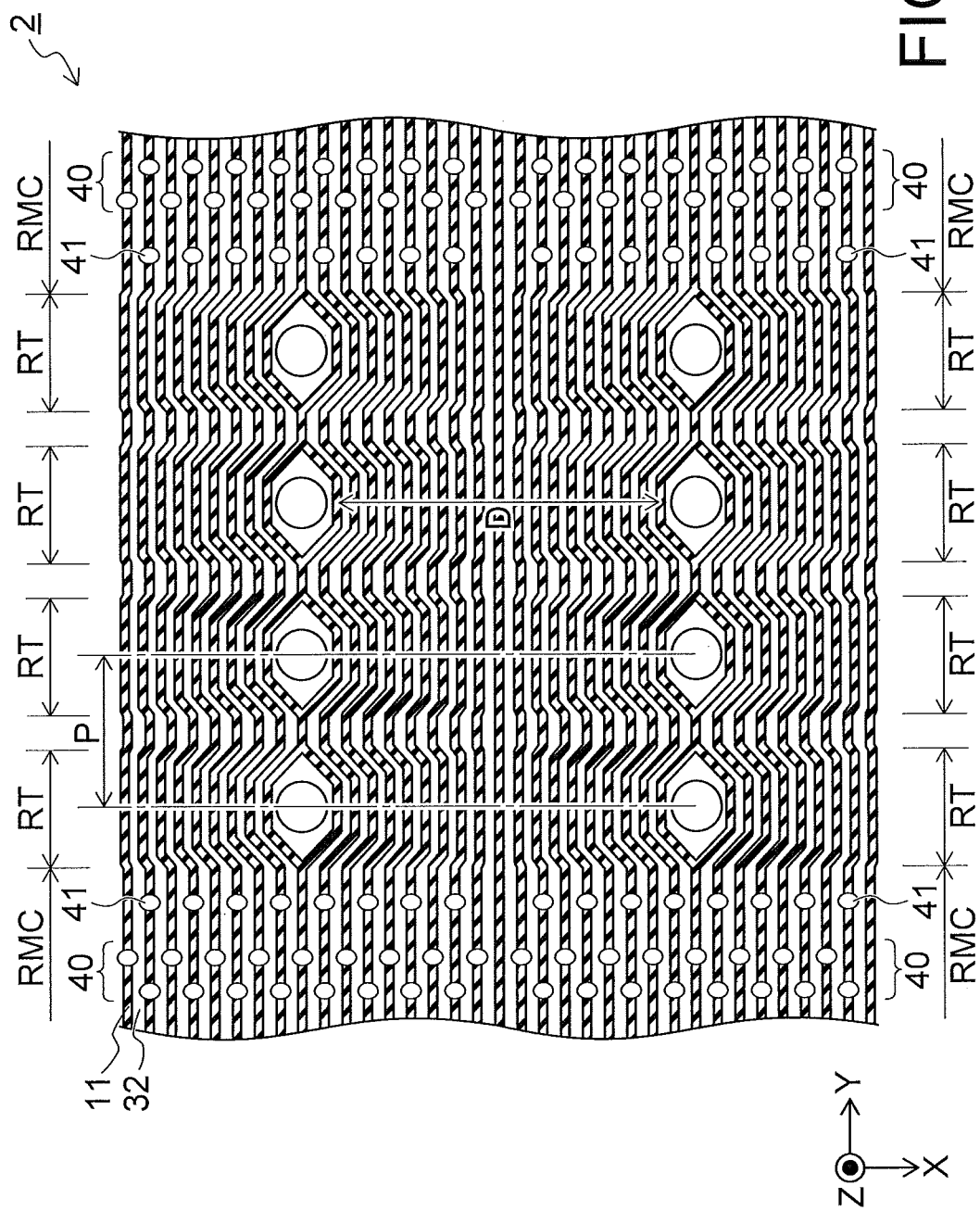
FIG. 8 is a plan view of a semiconductor memory device according to a second embodiment.

FIG. 8 is a plan view of a semiconductor memory device according to a second embodiment. The same reference numerals are assigned to components similar to those in the semiconductor memory device 1 according to the first embodiment, and detailed description will be omitted.

As illustrated in FIG. 8, at the semiconductor memory device 2 according to the present embodiment, each one of a plurality of contact portions 50 arranged along the Y direction is provided within each of the tap regions RT. Specifically, by branching and merging of the insulators 11 in the Y direction being repeated, a plurality of tap regions RT are formed, and the contact portions 50 are disposed at equal intervals.

Further, in the present embodiment, a plurality of lines each in which a plurality of contact portions 50 are arranged in the Y direction at equal intervals, are provided. Center pitches P of the contact portions 50 are the same between the lines adjacent to each other in the X direction. That is, in the present embodiment, a plurality of contact portions 50 are arranged in a matrix in the X direction and in the Y direction.

The insulator 11 is embedded within the first slit 11a patterned using the mask 70 (see FIG. 4A and FIG. 4B) in a similar manner to the first embodiment. At this time, in the first embodiment, a plurality of contact portions 50 are provided within one tap region RT. Therefore, if an interval of the contact portions 50 is large, a tap region RT which is long in the Y direction is required.

Because, in the present embodiment, a plurality of contact portions 50 are respectively provided within the plurality of tap regions RT. Therefore, because the length of the tap region RT in the Y direction can be suppressed, the length of the mask 70 in the Y direction can be also suppressed. By this means, because it is possible to avoid buckling of the mask 70, it is possible to further improve workability of the first slit 11a.

Therefore, according to the present embodiment, it is possible to improve workability of the first slit 11a as well as workability of the contact portion 50. Note that, also in the present embodiment, the planar shape of the tap region RT is not limited to a hexagon, and, for example, may be a rectangle.

Third Embodiment

Figure 9:
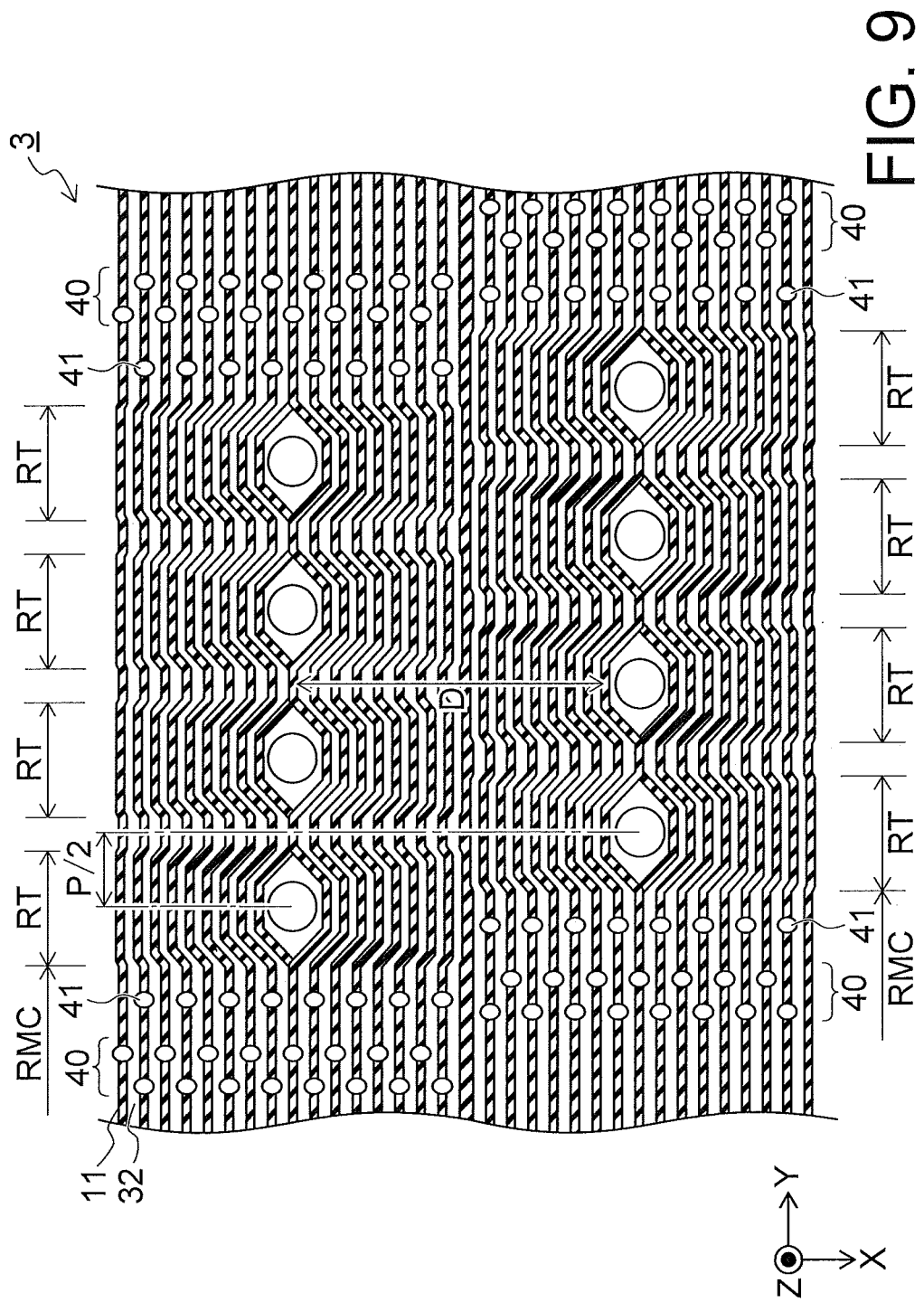
FIG. 9 is a plan view of a semiconductor memory device according to a third embodiment.

FIG. 9 is a plan view of a semiconductor memory device according to a third embodiment. The same reference numerals are assigned to components similar to those in the semiconductor memory device 1 according to the first embodiment described above, and detailed description will be omitted.

In the semiconductor memory device 3 illustrated in FIG. 9, in a similar manner to the second embodiment, each one of the plurality of contact portions 50 is provided within each of the tap regions RT. Further, a plurality of lines each in which the plurality of contact portions 50 are arranged in the Y direction at equal intervals, are provided.

However, in the present embodiment, lines adjacent to each other in the X direction are displaced from each other by half of the center pitch P of the contact portion 50. That is, in these lines, a merging portion of the insulators 11 faces a branching portion of the insulators 11 in the X direction.

Meanwhile, in the second embodiment, as illustrated in FIG. 8, branching portions of the insulators 11 face each other in the X direction. Therefore, a shortest distance D between the lines of the contact portions 50 adjacent to each other in the X direction in the semiconductor memory device 3 according to the present embodiment becomes longer than a shortest distance D in the semiconductor memory device 2 according to the second embodiment. As a result of the shortest distance D becoming longer, a width of the electrode film 32 disposed between the lines of the contact portions 50, in other words, a width of the mask 70 becomes wider. Therefore, the mask pattern is further less likely to collapse upon work of the first slit 11a.

Therefore, according to the present embodiment, it is possible to further improve workability of the first slit 11a compared to the second embodiment. Note that, also in the present embodiment, the planar shape of the tap region RT is not limited to a hexagon, and, for example, may be a rectangle.

Fourth Embodiment

Figure 10:
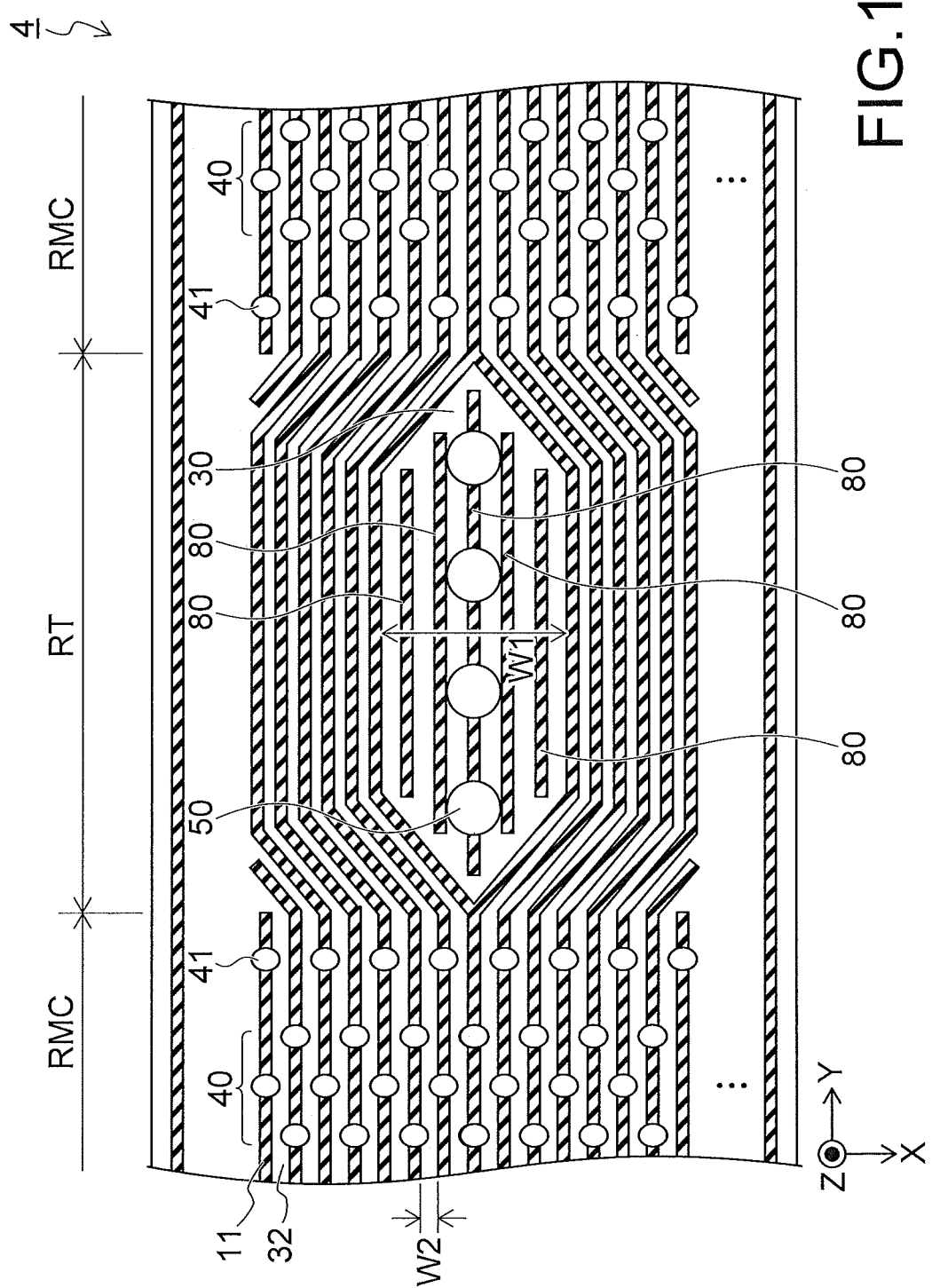
FIG. 10 is a plan view of a semiconductor memory device according to a fourth embodiment.
Figure 11:
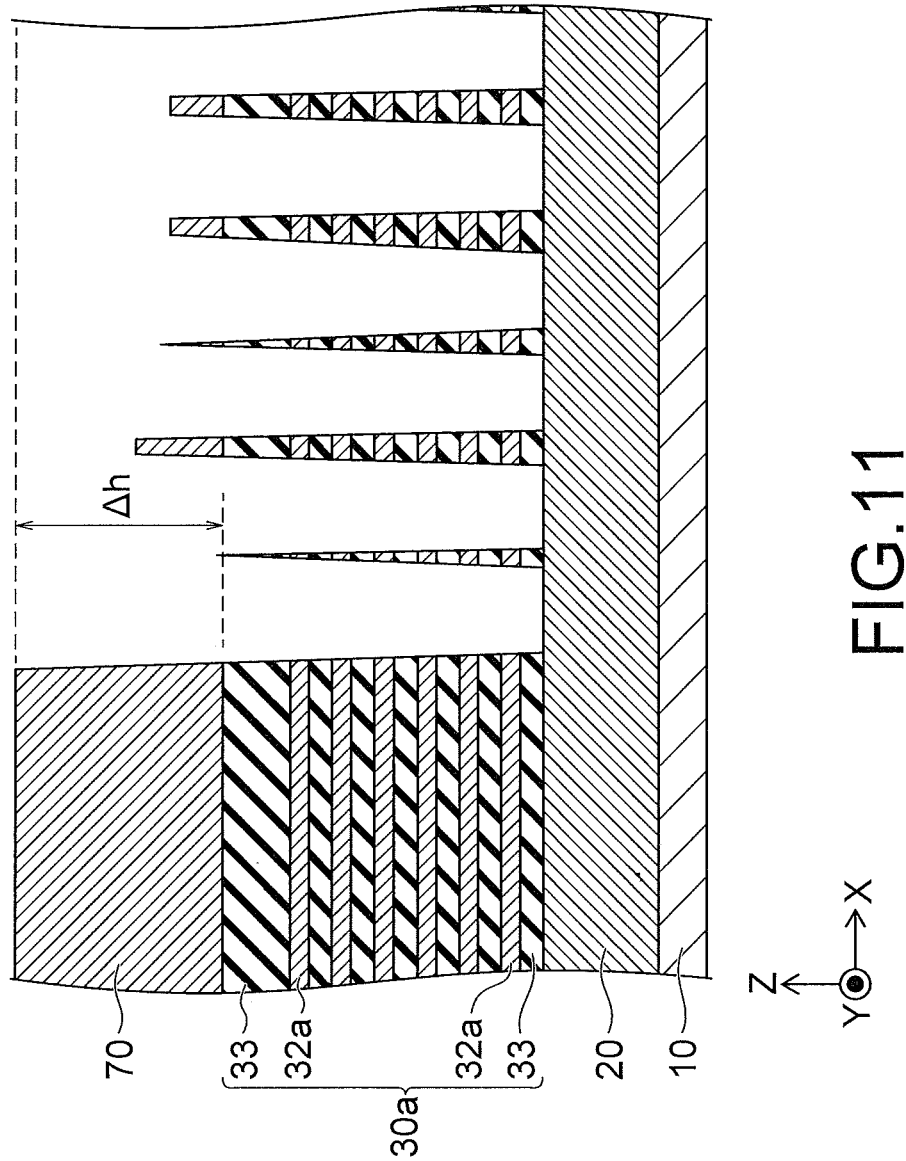
FIG. 11 is a cross-section diagram illustrating aspect where a pattern of a mask 70 collapses.

FIG. 10 is a planar view of a semiconductor memory device according to a fourth embodiment. The same reference numerals are assigned to components similar to those in the semiconductor memory device 1 according to the above-described first embodiment, and detailed description will be omitted.

As illustrated in FIG. 10, an insulator 80 is provided at the semiconductor memory device 4 according to the present embodiment. The insulator 80 is an example of the second insulator, and splits the laminated body 30 in the second direction within the tap region RT. The insulator 80 contains, for example, silicon oxide.

The tap region RT is formed by the mask 70 being patterned in similar manner to the first embodiment.

A manufacturing method of the tap region RT of the semiconductor memory device 1 in the present embodiment will be described below.

Figure 12:
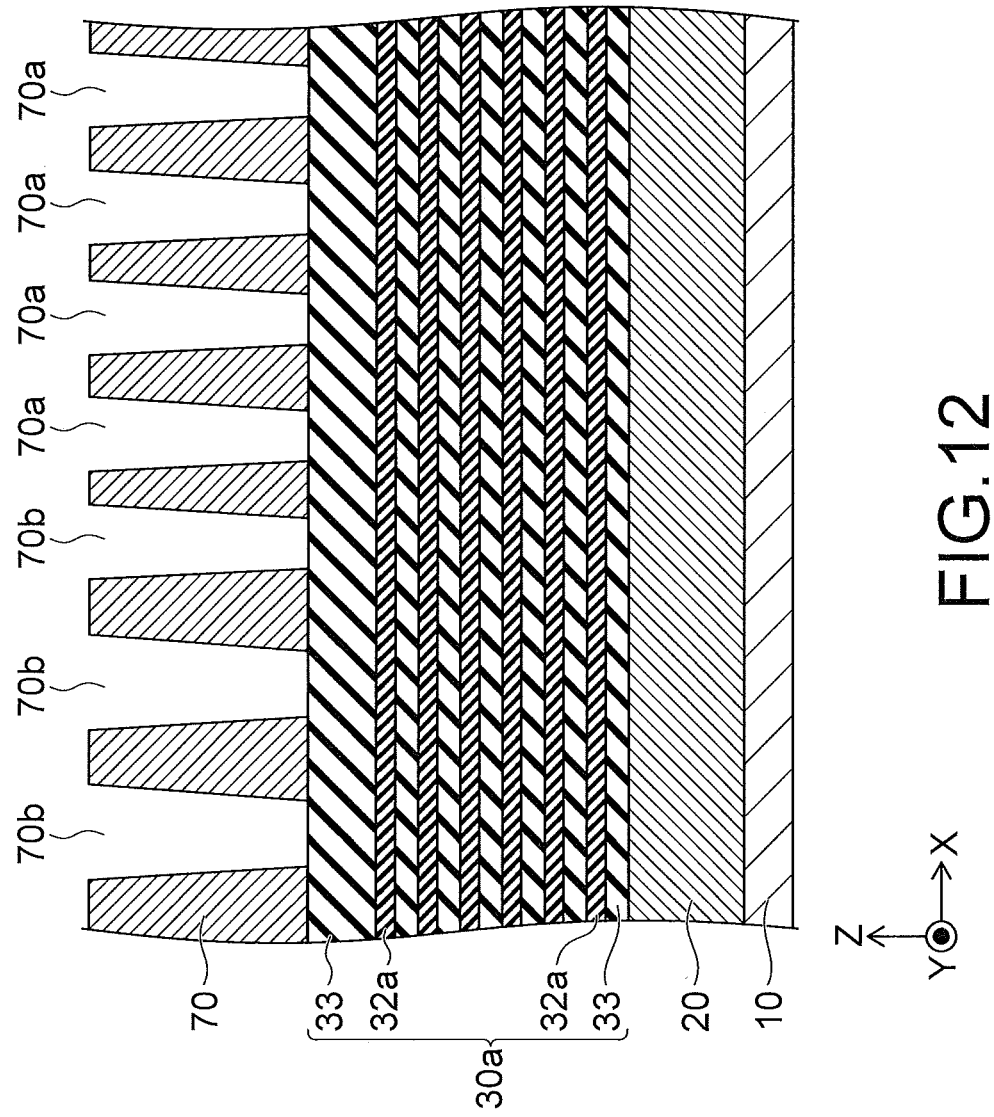
FIG. 12 is a cross-section diagram illustrating a pattern of a mask used in the fourth embodiment.

In the present embodiment, as illustrated in FIG. 12, a slit 70b is formed at a portion where the contact portion 50 is to be formed in the mask 70. At this time, in order to make the widths of the masks 70 equal in the X direction, it is preferable to form the slit 70a and the slit 70b at equal intervals. In other words, a repetition pitch of a portion where the mask 70 exists and the slit 70b in the X direction in the tap region RT is preferably equal to that in the memory cell region RMC.

Figure 13:
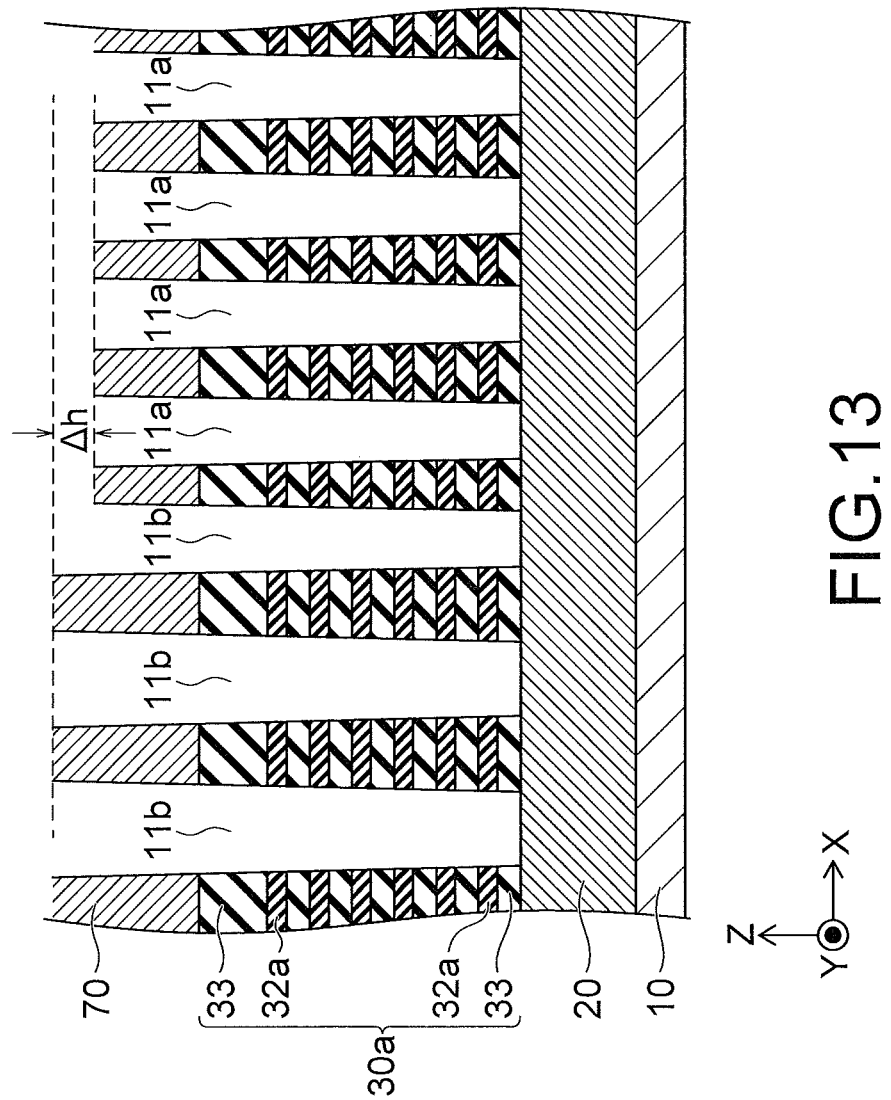
FIG. 13 is a cross-section diagram illustrating slit formation process in the fourth embodiment.

Subsequently, the laminated body 30a is etched in the Z direction from the slit 70a and the slit 70b of the mask 70 through RIE. As a result, as illustrated in FIG. 13, a first slit 11a and a second slit 11b are formed at the laminated body 30a. In the present embodiment, because the slit 70b is formed at the mask 70, a difference in the residual film Δh is reduced compared to a case where only the slit 70a is formed. Therefore, it is possible to avoid collapse of the pattern of the mask 70 during etching of the laminated body 30a, so that work of the first slit 11a becomes stable.

Figure 14:
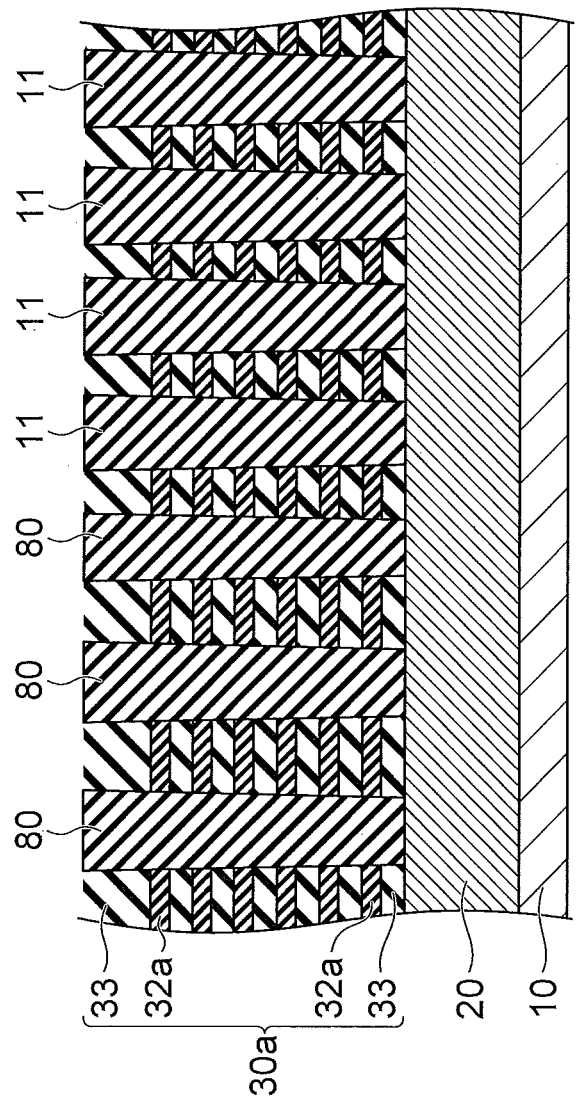
FIG. 14 is a cross-section diagram illustrating insulator embedment process in the fourth embodiment.

Subsequently, as illustrated in FIG. 14, the insulator 11 is embedded within the first slit 11a, and the insulator 80 is embedded within the second slit 11b. Thereafter, a hole (not illustrated) which penetrates through part of the insulator 80 and the laminated body 30a in the Z direction is formed, and the contact portion 50 is formed inside this hole.

According to the present embodiment as described above, the difference in the residual film Δh of the mask 70 is reduced by the slit 70b being also formed at a portion where the contact portion 50 is to be formed. By this means, it is possible to avoid collapse of the pattern of the mask 70, so that workability of the first slit 11a is improved. Further, because the second slit 11b formed at the laminated body 30a by the slit 70b is blocked with the insulator 80, a region where the contact portion 50 is to be formed can be sufficiently secured within the tap region RT. Therefore, workability of the contact portion 50 does not degrade.

Figure 15:
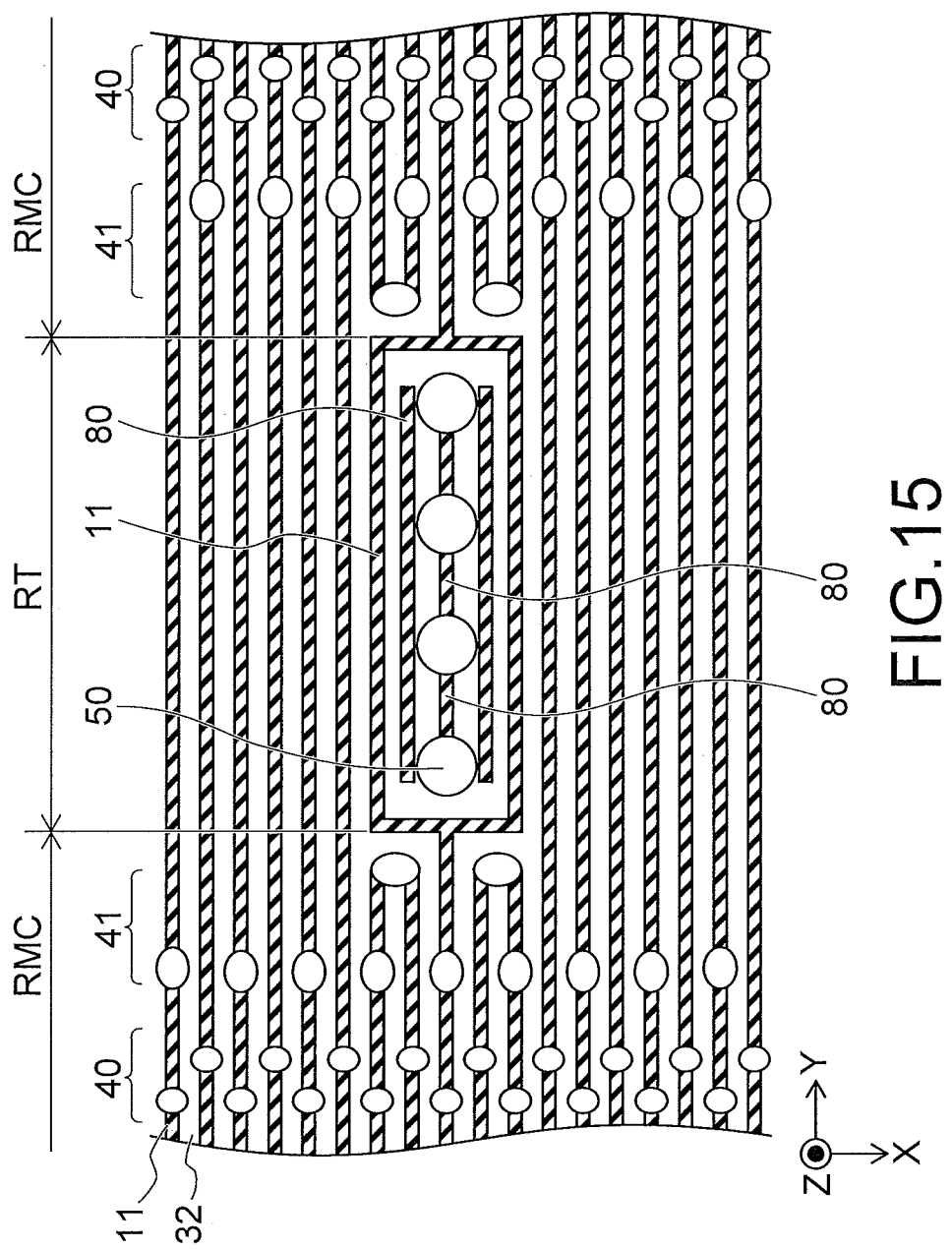
FIG. 15 is a plan view illustrating a modified example of the tap region RT.

Note that, also in the present embodiment, the planar shape of the tap region RT is not limited to a hexagon, and, for example, may be a rectangle as illustrated in FIG. 15. Also in this case, by the second slit 11b formed within the tap region RT being embedded with the insulator 80, a region where the contact portion 50 is to be formed is sufficiently secured, and, by this means, it is possible to improve workability of the contact portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
    a semiconductor substrate, the semiconductor substrate having a first region and a second region adjacent to the first region in a first direction parallel to the semiconductor substrate;
    a laminated body including a plurality of electrode layers laminated on the first region and the second region of the semiconductor substrate in a second direction perpendicular to the semiconductor substrate;
    a first insulator splitting the laminated body at the second region in a third direction orthogonal to the first direction and second direction, and extending in the first direction and the second direction, and branching into two insulator films at the first region, and enclosing continuously a first portion of the laminated body with the two insulator films;
    a contact portion extending in the first portion of the laminated body in the second direction; and
    a memory portion extending through the laminated body and the first insulator in the second direction at the second region,
    wherein a first width in the third direction of the first portion of the laminated body is wider than a second width in the third direction of at least one of the electrode layers split with the first insulator at the second region.

2. The semiconductor memory device according to claim 1, further comprising:
    a conductive layer provided between the semiconductor substrate and the laminated body,
    wherein a lower end of the contact portion is connected to the conductive layer.

3. The semiconductor memory device according to claim 1,
    wherein a plurality of the contact portions are provided within the one first portion.

4. The semiconductor memory device according to claim 1, further comprising:
    a second insulator to extend in the first direction and partially split the laminated body within the first portion.

5. The semiconductor memory device according to claim 4,
    wherein the contact portion penetrates through the second insulator.

* * * * *